(12) United States Patent
Cohen et al.

(10) Patent No.: US 11,647,684 B2
(45) Date of Patent: May 9, 2023

(54) NONVOLATILE TUNABLE CAPACITIVE PROCESSING UNIT

(71) Applicant: International Business Machines Corporation, Armonk, NY (US)

(72) Inventors: Guy M. Cohen, Westchester, NY (US); Takashi Ando, Eastchester, NY (US); Nanbo Gong, White Plains, NY (US); Yulong Li, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 17/216,937

(22) Filed: Mar. 30, 2021

(65) Prior Publication Data

US 2022/0320428 A1   Oct. 6, 2022

(51) Int. Cl.
*H01L 45/00* (2006.01)
*G11C 13/00* (2006.01)
*H01L 27/24* (2006.01)
*H01L 49/02* (2006.01)

(52) U.S. Cl.
CPC ........ *H01L 45/144* (2013.01); *G11C 13/0004* (2013.01); *G11C 13/0061* (2013.01); *H01L 27/2436* (2013.01); *H01L 28/56* (2013.01); *H01L 45/06* (2013.01); *H01L 45/126* (2013.01);
(Continued)

(58) Field of Classification Search
CPC ... H01L 45/144; H01L 27/2436; H01L 28/56; H01L 45/06; H01L 45/126; H01L 45/146; H01L 45/1608; G11C 13/0004; G11C 13/0061; G11C 2013/008
See application file for complete search history.

(56) References Cited

U.S. PATENT DOCUMENTS

| | | |
|---|---|---|
| 7,796,454 B2 | 9/2010 | Lin |
| 8,054,698 B2 | 11/2011 | De Sandre |
| 8,437,174 B2 | 5/2013 | Meade |

(Continued)

OTHER PUBLICATIONS

Jiang et al., "Design, Fabrication and Characterization of a PCM-Based Compact 4-Bit Capacitor Bank", IEEE/MTT-S International Microwave Symposium—IMS, pp. 736-738, © 2018 IEEE, 3 Pages.
(Continued)

*Primary Examiner* — Jerome Leboeuf
(74) *Attorney, Agent, or Firm* — Stephen R. Yoder

(57) ABSTRACT

In an approach for forming a nonvolatile tunable capacitor device, a first electrode layer is formed distally opposed from a second electrode layer, the first electrode layer configured to make a first electrical connection and the second electrode layer configured to make a second electrical connection. A dielectric layer is posited between the first electrode layer and adjacent to the second electrode layer. A phase change material (PCM) layer is posited between the first electrode layer and the second electrode layer adjacent to the dielectric layer. An energizing component is provided to heat the PCM layer to change a phase of the PCM layer. The energizing component may include a heating element or electrical probe in direct contact with the PCM layer, that when energized is configured to apply heat to the PCM layer. The phase of the PCM layer is changeable between an amorphous phase and a crystalline phase.

6 Claims, 11 Drawing Sheets

(52) U.S. Cl.
CPC ........ *H01L 45/146* (2013.01); *H01L 45/1608* (2013.01); *G11C 2013/008* (2013.01)

(56) References Cited

U.S. PATENT DOCUMENTS

| | | |
|---|---|---|
| 8,605,488 B2 | 12/2013 | Strukov |
| 9,253,822 B2 | 2/2016 | Lamorey |
| 9,824,825 B2 | 11/2017 | Reig |
| 10,249,440 B2 | 4/2019 | Lazarus |
| 10,505,108 B2 | 12/2019 | Marukame |
| 2011/0038093 A1 | 2/2011 | Furukawa |
| 2014/0369114 A1* | 12/2014 | Kim .................. G11C 11/5678 365/163 |
| 2014/0376149 A1 | 12/2014 | Lamorey |
| 2018/0082168 A1* | 3/2018 | Marukame .......... H01L 27/2463 |
| 2018/0254083 A1* | 9/2018 | Czornomaz ........ G11C 13/0004 |
| 2019/0148635 A1* | 5/2019 | Jonnalagadda ....... H01L 45/144 365/163 |
| 2019/0393266 A1* | 12/2019 | Ando ................. H01L 45/1683 |
| 2020/0104694 A1* | 4/2020 | Nikonov ................. H03B 1/02 |
| 2022/0198247 A1* | 6/2022 | Ma ......................... G11C 11/54 |

OTHER PUBLICATIONS

"Capacitor", Wikipedia, Page last updated Mar. 22, 2021, Printed Jun. 20, 2022, 33 pages, <https://en.wiktpedia.org/w/index.php?title=Capacitor&oldid= 1_01366921_7>.

"Patent Cooperation Treat PCT Notification of Transmittal of the International Search Report and the Written Opinion of the International Searching Authority, or the Declaration", International application No. PCT/EP2022/056663, International filing date Mar. 15, 2022, dated Jun. 28, 2022, 12 pages.

\* cited by examiner

NONVOLATILE TUNABLE CAPACITIVE PROCESSING UNIT

BACKGROUND

The present application relates to a capacitive processing device and a method of forming the same. More particularly, the present application relates to a nonvolatile tunable capacitive processing unit (CPU) device and its application for artificial intelligence (AI) hardware.

Resistive Processing Units (RPUs) are used in Deep Neural Network (DNN) processing to accelerate training and inference of machine learning models. The RPU element may be implemented using phase change material in the form of a resistor since these materials' resistance can be tuned and they further maintain the resistance to which they were tuned (memory function) without being connected to a power source (nonvolatile memory function).

A common operation in digital signal processing circuits is multiply-accumulate (MAC), which is performed by a MAC unit that computes the product of two numbers and adds that product to an accumulator. A MAC unit includes a multiplier implemented in combinational logic followed by an adder and an accumulator register that stores the result. As an example, a finite impulse response (FIR) filter implementation consists of primarily MAC operations where the input samples to the filter are multiplied by the filter coefficients and the products are sum up. The implementation of DNNs also requires many uses of the MAC operation. More specifically, the implementation of each layer of the DNN requires the multiplication of each input (e.g., from a previous layer) by a weight and then summing up all the products. The DNN can be implemented using a digital processor but can also be realized using an analog circuit. Analog implementation of the DNN uses tunable resistors (e.g., RPUs) and Ohm's law to calculate the products, followed by Kirchhoff law to perform the summation of the products. The tunable resistors are typically implemented using phase change material (PCM) which may have high conductance when the PCM is in the crystalline phase and low conductance when the PCM is in the amorphous phase. It is possible to tune the PCM element to an intermediate conductance level between the two ends of the conductance range. When voltage is applied to the PCM element the current through the PCM element will be the conductance (G) times the voltage (V), i.e., I=V×G. In the case of a DNN, the voltage, $V_k$ will represent an input and the conductance $G_j$ will represent a synaptic weight. The input $V_k$ will be applied to all the weights $G_j$, in which j=(1 to N) and all the currents will be summed up using Kirchhoff's law. Hence, a MAC operation was implemented in an analog fashion.

One of the disadvantages of the analog implementation of the MAC operation described above is that each product computation dissipates energy equal to $I^2/G$ (i.e., the current to the power of two times the resistance). The power dissipation may be substantial if the DNN is large and furthermore, when the DNN is part of a battery powered device, reducing power dissipation is crucial. As such there is a need a need for a memory-based processing unit that is more power efficient.

SUMMARY

A nonvolatile tunable capacitive processing unit (CPU) and a method for forming the same is described.

The method for forming a nonvolatile tunable capacitor device may include forming a first electrode layer distally opposed from a second electrode layer, the first electrode layer configured to make a first electrical connection and the second electrode layer is configured to make a second electrical connection. The method may further include positing a dielectric layer between the first electrode layer adjacent to the first inner planar surface and adjacent to the second inner planar surface of the second electrode layer. The method may further include positing a phase change material (PCM) layer between the first electrode layer and the second electrode layer adjacent to the dielectric layer. The method may further include providing an energizing component to heat the PCM layer to change a phase of the PCM layer.

The first electrode layer may include a first inner planar surface distally opposed from a second inner planar surface of the second electrode layer. The first electrode layer may include a first outer planar surface configured to make the first electrical connection and the second electrode layer may include a second outer planar surface configured to make the second electrical connection.

The energizing component may include a heating element that is coplanar with either one of the first electrode layer and the second electrode layer, which when energized is configured to apply heat to the PCM layer.

The energizing component may include a resistive element in direct contact with the PCM layer, which when energized is configured to apply heat to the PCM layer.

The phase of the PCM layer may be selectively changeable between at least an amorphous phase corresponding to a resistive PCM layer and a crystalline phase corresponding to a conductive PCM layer. The PCM layer may include a composition of $Ge_2Sb_2Te_5$, GeTe, or $Sb_2Te_3$. The dielectric layer may include a composition of $HfO_2$.

In another embodiment, a nonvolatile tunable capacitor device is described. The device may include an outer cylindrical electrode layer having a first diameter; an inner cylindrical electrode layer axially proximal to the outer cylindrical electrode layer, the inner cylindrical electrode layer having a second diameter that is less than the first diameter; a dielectric layer disposed between and throughout opposing surfaces of the outer cylindrical electrode and the inner cylindrical electrode; a phase change material (PCM) layer disposed between and throughout opposing surfaces of the inner cylindrical electrode and the dielectric layer; and a heating element layer disposed between the outer cylindrical electrode and the inner cylindrical electrode. The heating element layer may be configured to be energized to apply heat to the PCM layer.

The nonvolatile tunable capacitor device may further include a resistive element in direct contact with the PCM layer, which when energized may be configured to apply heat to the PCM layer.

The nonvolatile tunable capacitor device may further include the PCM layer having a phase that is configured to change from an amorphous phase corresponding to a resistive PCM layer to a crystalline phase corresponding to a conductive PCM layer based on a predefined amount of heat applied to the PCM layer.

In another embodiment, a method of performing a multiply-accumulate (MAC) operation for a Neural Network (NN), the method comprising providing one or more circuit configurations, wherein the one or more circuit configurations may include a charging transistor, a discharging transistor and a tunable capacitor. In an embodiment, the charging transistor includes a first charging transistor terminal connected to a voltage line. Further, the charging transistor also includes second charging transistor terminal connected to a first capacitor terminal of a tunable capacitor, wherein the tunable capacitor includes a second capacitor terminal connected to a ground terminal. Further, the one or more circuit configurations may further include a discharging transistor that includes a first discharging transistor terminal connected to the second charging transistor terminal and the first capacitor terminal. Further, the discharging transistor also includes a second discharging terminal connected to a current line.

Further, the method of performing the MAC operation for a NN may include providing a predefined amount of heat to the tunable capacitor for a predefined amount of time, wherein the tunable capacitor has a first capacitance value, and the predefined amount of heat may be sufficient to change the first capacitance value to a second capacitance value.

The method of performing the MAC operation for a NN may include charging the tunable capacitor for a first predefined amount of time by applying an input voltage to the tunable capacitor via the charging transistor in a closed state and the discharging transistor in an open state; and discharging the tunable capacitor for a second predefined amount of time by stopping the input voltage to the tunable capacitor via the charging transistor in the open state and the discharging transistor in the closed state, wherein charges flow from the tunable capacitor through the discharging transistor to an integrator circuit.

In an embodiment, the method of performing the MAC operation for a NN, wherein providing the predefined amount of heat is configured to set the tunable capacitor to a weight of the NN represented as the second capacitance value.

In an embodiment, the method of performing the MAC operation for a NN may further include determining a total charge of the one or more circuit configurations comprising the tunable capacitor by integrating the charges of the one or more circuit configurations through the discharging transistor using the integrator circuit.

In an embodiment, the method of performing the MAC operation for a NN, wherein providing the predefined amount of heat is configured to set the tunable capacitor to a weight of the NN represented as the second capacitance value.

In an embodiment, a phase of the PCM layer may be selectively changeable between an amorphous phase corresponding to a resistive PCM layer to a crystalline phase corresponding to a conductive PCM layer.

DETAILED DESCRIPTION

Figure 1:
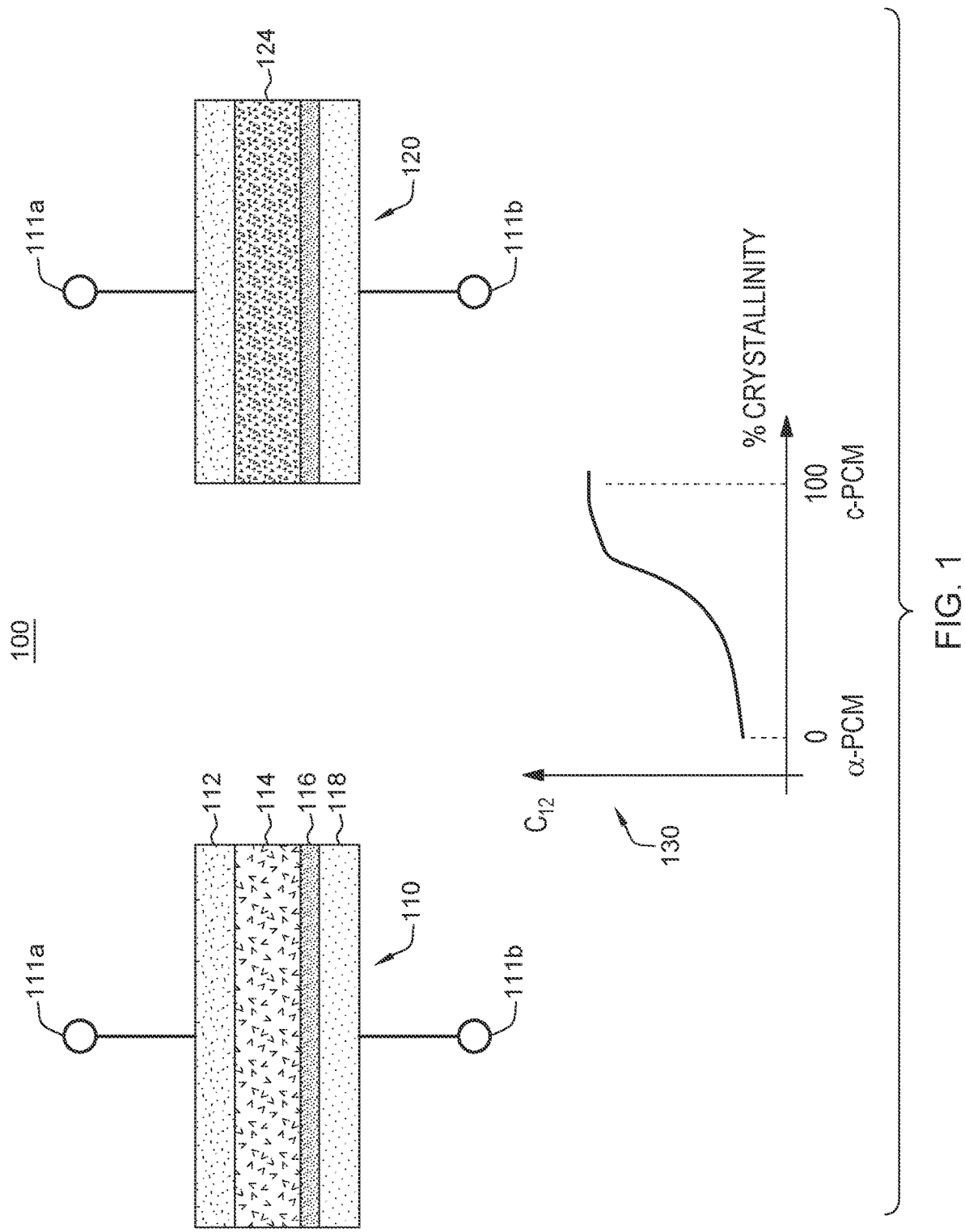
FIG. 1 is a cross-sectional view of a tunable capacitor device of the present application during an amorphous stage and a crystalline stage of fabrication, according to an example embodiment of the present invention.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The embodiments described herein may be implemented and used in many applications to perform analog calculations in artificial intelligence (AI) operations. For example, in performing a multiply and accumulate (MAC) operation, the product of two numbers is determined by multiplying and then the products are added to output a sum. The MAC operation may be used in a Neural Network (NN). To expedite the computation of the NN, the MAC operations need to be performed in parallel. Furthermore, there in a need for the calculation to be energy efficient so large NNs which comprise of millions of weight multiplications, can be realized. Thus, a solution is needed to accelerate the MAC operations and execute them in a more efficient manner.

In a neural network, a circuit array architecture may include input nodes (e.g., $V_1$, $V_2$, $V_n$) configured to receive an electrical input or vector inputs to each node, wherein the electrical input may be applied to weights (e.g., $W_1$, $W_2$, $W_n$) configured to be trained by and stored in the neural network. For example, in performing a MAC operation in a neural network, a tunable capacitor device may be used in a first portion of the neural network to store weights corresponding to the capacitance value for each respective tunable capacitor device. When an input voltage (e.g., $V_1$) is applied to a first tunable capacitor device (e.g., $C_1$), the electronic charge on the tunable capacitor device would be the product of the input voltage and the capacitance of the first tunable capacitor device (e.g., $Q_1$). Each of the tunable capacitor devices $C_k$ will hold a charge that is the product of the voltage $V_k$ times $C_k$.

The power dissipation for any circuit element is $I^2R$, where I represents the current flowing through the element and R is the resistance of the element. An ideal capacitor, therefore, does not dissipate power when charged or discharged. However, small parasitic resistance does exist, such as the lead resistance of interconnects in a circuit, so some power dissipation will take place.

FIG. 1 is a cross-sectional view of a tunable capacitor device 100 of the present application in an amorphous state (110) and in a crystalline state (120), according to an example embodiment of the present invention.

Tunable capacitor device 100 shown in FIG. 1 is an example of a plate capacitor that includes first electrode layer 112 distally opposed from second electrode layer 118, wherein first electrode layer 112 is configured to make first a electrical connection (e.g., via first terminal 111a) and second electrode layer 118 is configured to make a second electrical connection (e.g., via second terminal 111b) to an external voltage source. First electrode layer 112 may include a heating element (e.g., a proximity heater) configured to generate heat to apply to adjacent components of tunable capacitor device 100. The heating element may be posited within or adjacent to any other layer in tunable capacitor device 100 such that the heating element is within sufficient proximity to heat intended components therein.

The method of forming tunable capacitor device 100 may include positing dielectric layer 116 between first electrode layer 112 and second electrode layer 118, wherein each layer has planar surfaces (e.g., topmost surface, bottommost surface). Dielectric layer 116 may be posited directly between first electrode layer 112 and second electrode layer 118 or indirectly between first electrode layer 112 and second electrode layer 118, wherein an intervening adjacent layer may be posited between dielectric layer 116 and one of first electrode layer 112 and second electrode layer 118. Dielectric layer 116 may include a composition of hafnium oxide $HfO_2$. In an embodiment, a composite dielectric layer may be partitioned into two portions, a first portion to include dielectric layer 116 and a second portion to include a phase change material (PCM) layer 114 (e.g., a layer of about 3 to 10 nm thick), wherein dielectric layer 116 may be composed of a hafnium oxide $HfO_2$ layer (e.g., a layer of about 2 nm to 5 nm thick), as further described below.

The method of forming tunable capacitor device 100 may further include positing PCM layer 114 between first electrode layer 112 and second electrode layer 118 adjacent to dielectric layer 116. In an embodiment, PCM layer 114 may be positioned directly adjacent to first electrode layer 112 including the heating element such that heat generated from the heating element will change the temperature of PCM layer 114.

The method of forming tunable capacitor device 100 may further include providing an energizing component (e.g., to heat PCM layer 114 to change a phase of PCM layer 114). The energizing component may be a heating element that is coplanar with either one of first electrode layer 112 or second electrode layer 118, which when energized is configured to apply heat to PCM layer 114. The energizing component may be a resistive element in direct contact with PCM layer 114, which when energized is configured to apply heat to PCM layer 114. Other energizing components may be used so long as it is configured to heat the PCM layer sufficient to change a phase of PCM layer 114 to the intended phase.

In an embodiment, the energizing component is a proximity heater (not shown) in direct contact with PCM layer 114, which when energized is configured to apply heat to PCM layer 114.

In an embodiment, tunable capacitor device 100 may include PCM layer 114 that is in a first phase 110 corresponding to an amorphous phase, wherein PCM layer 114 is a highly resistive material that resembles a dielectric material. Heat may be applied to PCM layer 114 to change the phase from the first phase 110 (e.g., completely amorphous phase) to a mix of amorphous and crystalline and ultimately to a second phase 120 (e.g., crystalline phase), wherein PCM layer 124 is a highly conductive material that is semi-metallic.

In an embodiment, tunable capacitor device 100 may be tuned (i.e., heated to change the properties of PCM layer 114) by various methods. In one embodiment, a melt quench method may be provided where a high current pulse with an abrupt trailing end is applied to PCM layer 114, which when applied is configured to generate enough heat in PCM layer 114 such that a portion of PCM layer 114 will melt. As the trailing edge dissipates, PCM layer 114 is quickly cooled or returned to ambient temperature, so that there is little to no opportunity for PCM layer 114 to be crystallized and remains in the amorphous phase. In another embodiment, an annealing method may be provided where a pulse that heats PCM layer 114 is provided that is not sufficient to cause PCM layer 114 to melt, but the temperature exceeds the crystallization temperature while still in the amorphous stage to begin nucleating crystals.

In an embodiment, PCM layer 114 may be composed of germanium-antimony-telluride ($Ge_2Sb_2Te_5$), whose crystallization temperature is about 160-170 degrees celsius (C), and whose melting temperature may be approximately 600-700 degrees C. PCM layer 114 of this composition can be crystallized with a current pulse applied to the proximity heater that allows the PCM layer 114 to reach the crystallization temperature. For example, for PCM crystallization, the PCM does not need to be melted, rather just enough heat may be applied so that the PCM temperature may be sufficient to achieve crystallization.

In an embodiment, capacitance vs. phase change graph 130 for tunable capacitor device 100 may be provided to illustrate the relationship between the phase of PCM layer 114 and the capacitance (e.g., $C_{12}$) of tunable capacitor device 100. For example, as the phase of PCM layer 114 transitions from 0% crystallinity (e.g., amorphous PCM, or α-PCM) to 100% crystallinity (e.g., crystalline PCM, or c-PCM), the capacitance of tunable capacitor device 100 transitions from least capacitive to most capacitive. Thus, tunable capacitor device 100 may be tuned to a specific capacitive value by changing the crystallinity of PCM layer 114, as shown in capacitance vs. phase change graph 130.

It is noted that while a single first electrode layer 112 and a single second electrode layer 118 are described and illustrated, the present application can be used when a plurality of first electrode layers 112 and a plurality of second electrode layers 118 are formed.

In an embodiment, first electrode layer 112 may include a first outer planar surface (e.g., topmost planar surface) configured to make the first electrical connection via first terminal 111a electrically connected to the first outer planar surface of the first electrode layer 112. Second electrode layer 118 may include a second outer planar surface (e.g., bottommost planar surface) configured to make a second electrical connection via second terminal 111b electrically connected to the second outer planar surface of second electrode layer 118.

First electrode layer 112 and second electrode layer 118 may be composed of an electrically conductive metal or metal alloy. Examples of electrically conductive materials that may be used in the present application include titanium nitride (TiN), molybdenum (Mo), Tantalum Nitride (TaN), or Tungsten (W). Other inert materials may be used to reduce potential interactions with the PCM material.

First electrode layer 112 may be composed of a conductive material such as, for example, Tantalum (Ta), TaN, Titanium (Ti), TiN, Ruthenium (Ru), Ruthenium Nitride (RuN), Ruthenium Tantalum (RuTa), Ruthenium Tantalum Nitride (RuTaN), Cobalt (Co), Cobalt Tungsten Phosphorous (CoWP), Cobalt Nitride (CoN), W, Tungsten Nitride (WN) or any combination thereof. First electrode layer 112 may have a thickness from 2 nm to 100 nm; other thicknesses are possible and can be used in the present application as the thickness of first electrode layer 112. First electrode layer 112 may be formed by a deposition process such as, for example, evaporation, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides first electrode layer 112.

Second electrode layer 118 may be composed of one of the conductive materials mentioned above for first electrode layer 112. In one embodiment, the conductive material that provides second electrode layer 118 is compositionally different from first electrode layer 112. In another embodiment, the conductive material that provides second electrode layer 118 is compositionally the same as the first electrode layer 112. Second electrode layer 118 can have a thickness within the thickness range mentioned above for first electrode layer 112. Second electrode layer 118 may be formed utilizing one of the deposition processes mentioned above in providing first electrode layer 112, followed by performing a patterning process, such as, photolithography and etching.

In an embodiment, dielectric layer 116 is typically a dielectric material with a large dielectric constant (relative permittivity). Examples of dielectric materials with a large dielectric constant include hafnium silicate, zirconium silicate, hafnium dioxide and zirconium dioxide, and aluminum oxide. The dielectric constant for $Ge_2Sb_2Te_5$ is about 33. To obtain a large dynamic range for capacitance change (tunability) a large dielectric constant for layer 116 is desirable.

PCM layer 114 can be formed utilizing a deposition process such as, for example, PECVD, PVD, CVD, or ALD. PCM layer 114 may have a thickness from 3 nm to 20 nm. Other thicknesses are possible and can be employed as the thickness of PCM layer 114. In some embodiments, PCM layer 114 has a conformal thickness. The term "conformal" denotes that a material layer has a vertical thickness along horizontal surfaces that is substantially the same (i.e., within ±5%) as the lateral thickness along vertical surfaces.

Dielectric layer 116 may be formed prior to, or after, forming second electrode layer 118. In embodiments when dielectric layer 116 is formed, prior to second electrode layer 118, a blanket layer of dielectric capping material is formed and thereafter an opening is formed (by photolithography and etching) in the dielectric capping material. Second electrode layer 118, as defined below, is then formed in the opening. In such an embodiment, second electrode layer 118 is formed by deposition, followed by a planarization process. In embodiments in which second electrode layer 118 is formed prior to dielectric layer 116, second electrode layer 118 is formed by deposition and patterning, and thereafter the dielectric capping material is deposited and a subsequent planarization process may be performed.

Figure 2:
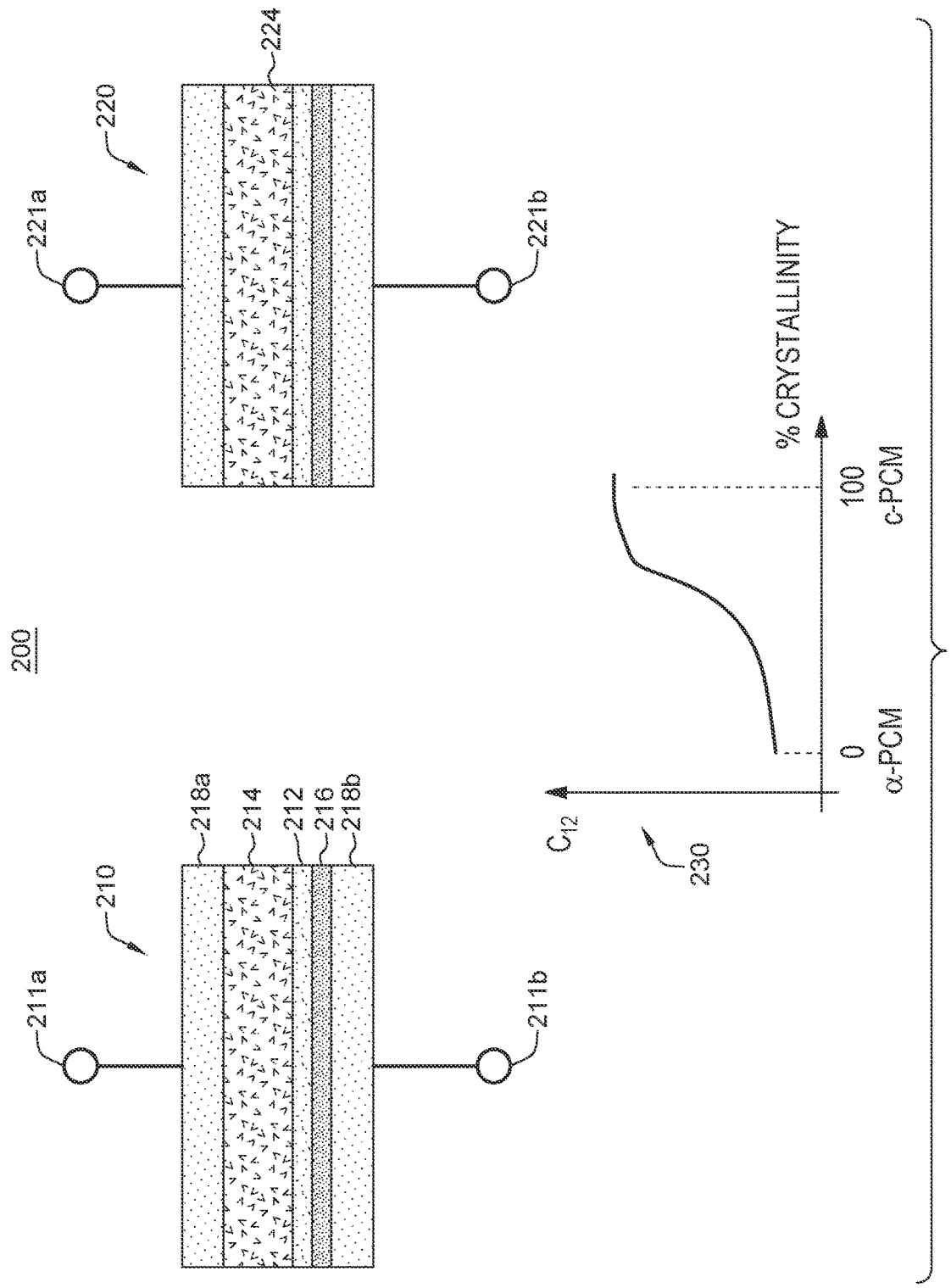
FIG. 2 is a cross-sectional view of another tunable capacitor device of the present application during an amorphous stage and a crystalline stage of fabrication, according to an example embodiment of the present invention.

FIG. 2 is a cross-sectional view of another tunable capacitor device of the present application in the amorphous state (e.g., first phase) and in the crystalline state (e.g., second phase), according to an example embodiment of the present invention.

Tunable capacitor device 200 shown in FIG. 2 is another example of a plate capacitor that includes first electrode layer 218a distally opposed from second electrode layer 218b, wherein first electrode layer 218a is configured to make first electrical connection 211a, 221a and second electrode layer 218b is configured to make second electrical connection 211b, 221b to an external voltage source. In this embodiment, tunable capacitor device 200 may include heating element 212 (e.g., a proximity heater) configured to generate heat to apply to adjacent components of tunable capacitor device 200. Heating element 212 may be posited within or adjacent to any other layer in tunable capacitor device 200 such that the heating element is within sufficient proximity to heat intended components therein. So instead of the heating element being adjacent to an electrode layer or being embedded in the electrode layer, or using the electrode layer itself as a heater, as described in FIG. 1, here heating element 212 is posited between PCM layer 214 and dielectric layer 216, which are both between first electrode layer 218a and second electrode layer 218b.

In an embodiment, tunable capacitor device 200 may include PCM layer 214 that is in a first phase 210 corresponding to an amorphous phase, wherein PCM layer 214 is a highly resistive material that resembles a dielectric material. Heat may be applied to PCM layer 214 to change the phase from the first phase 210 (e.g., completely amorphous phase) to a mix of amorphous and crystalline and ultimately to a second phase 220 (e.g., completely crystalline phase, wherein PCM layer 224 is a highly conductive material that is semi-metallic.

In this embodiment, phase change graph 230 for tunable capacitor device 200 is also provided to illustrate the relationship between the phase of PCM layer 214 and the capacitance (e.g., $C_{12}$) of tunable capacitor device 200. For example, as the phase of PCM layer 214 transitions from 0% crystallinity (e.g., α-PCM) to 100% crystallinity (e.g., c-PCM), the capacitance of tunable capacitor device 200 transitions from least capacitive to most capacitive. Thus, tunable capacitor device 200 may be tuned to a specific capacitive value by changing the crystallinity of PCM layer 214, as shown in the capacitance vs. phase change graph 230.

Figure 3:
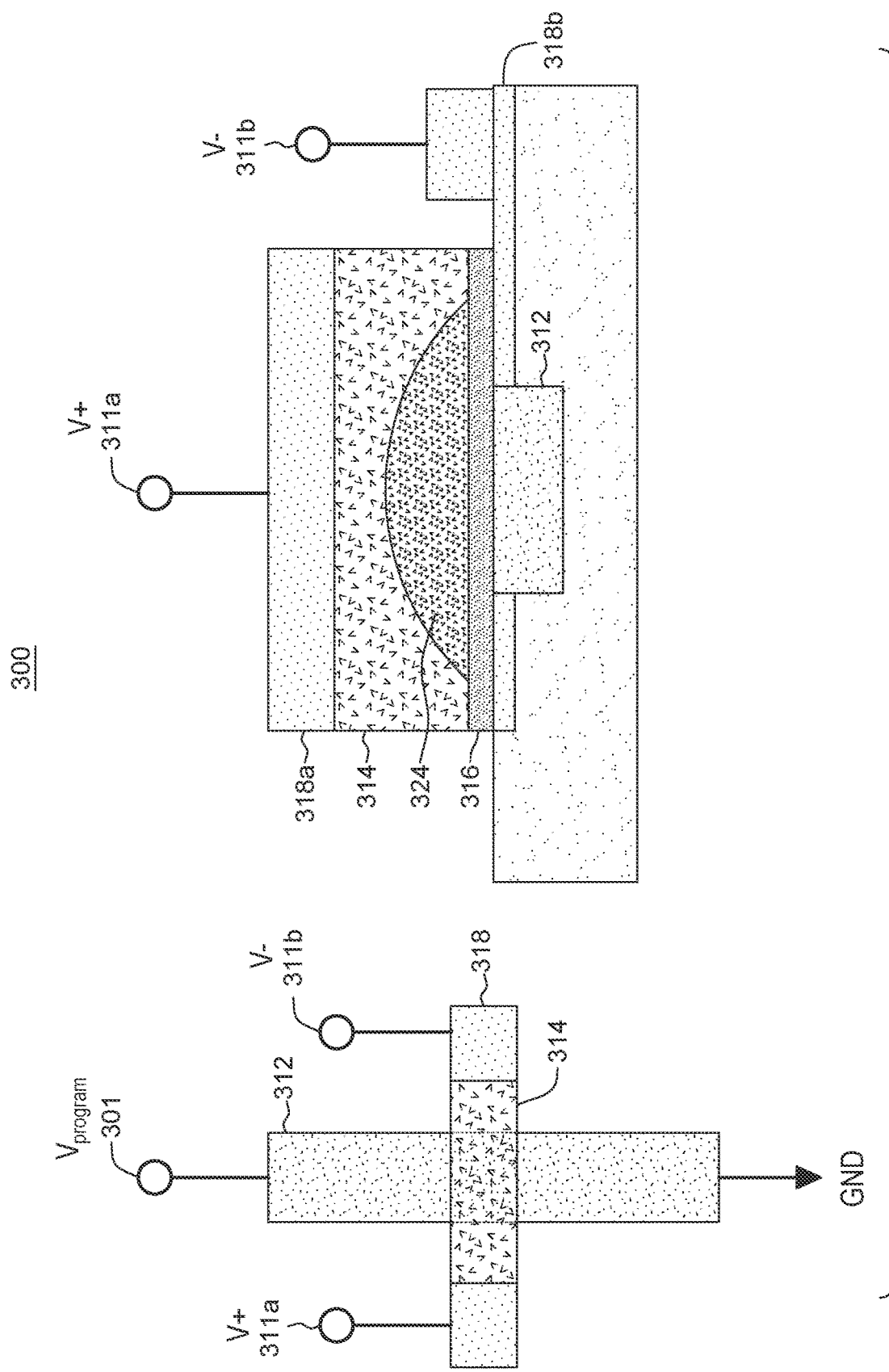
FIG. 3 illustrates various views of another tunable capacitor device of the present application during a tuning stage, according to an example embodiment of the present invention.

FIG. 3 illustrates various views of another tunable capacitor device of the present application during a tuning stage, according to an example embodiment of the present invention.

In an embodiment, heater 312 may be positioned beneath dielectric layer 316 and within the topmost planar surface of bottom electrode layer 318b, which when energized is configured to apply heat to dielectric layer 316 and PCM layer 314. Top electrode layer 318a is configured to make a first electrical connection via first terminal 311a electrically connected to a first outer planar surface of the top electrode layer 318a. Bottom electrode layer 318b may include a second outer planar surface (e.g., bottommost planar surface) configured to make a second electrical connection via second terminal 311b electrically connected to the second outer planar surface of bottom electrode layer 318b.

In an embodiment, tunable capacitor device 300 may be tuned (i.e., heated to change the properties of PCM layer 314) by various methods. In one embodiment, a melt quench method may be used where a high current pulse (e.g., applied via $V_{program}$ 301) with an abrupt trailing end is applied to PCM layer 314, which when applied is configured to generate enough heat in PCM layer 314 such that a portion of PCM layer 324 will melt. As the trailing edge dissipates, PCM layer 314 is quickly cooled or returned to ambient temperature, so that there is little to no opportunity for PCM layer 314 to be crystallized and remains in the amorphous phase. The region of amorphous material that forms is the amorphous dome shown as the portion of PCM layer 324. In another embodiment, an annealing method may be provided where heater 312 is energized with a pulse that heats PCM layer 314 but is not sufficient heat to cause PCM layer 314 to melt, but the temperature slightly exceeds the crystallization temperature while still in the amorphous stage to begin nucleating crystals.

In an embodiment, during tuning of tunable capacitor device 300, PCM layer 314 may begin with in a crystalline phase; as during fabrication, PCM layer 314 material is typically annealed and fully crystallized. When PCM layer 314 is in the crystalline phase, heat sufficient to melt PCM material must be applied to change PCM material to the amorphous phase.

Figure 4:
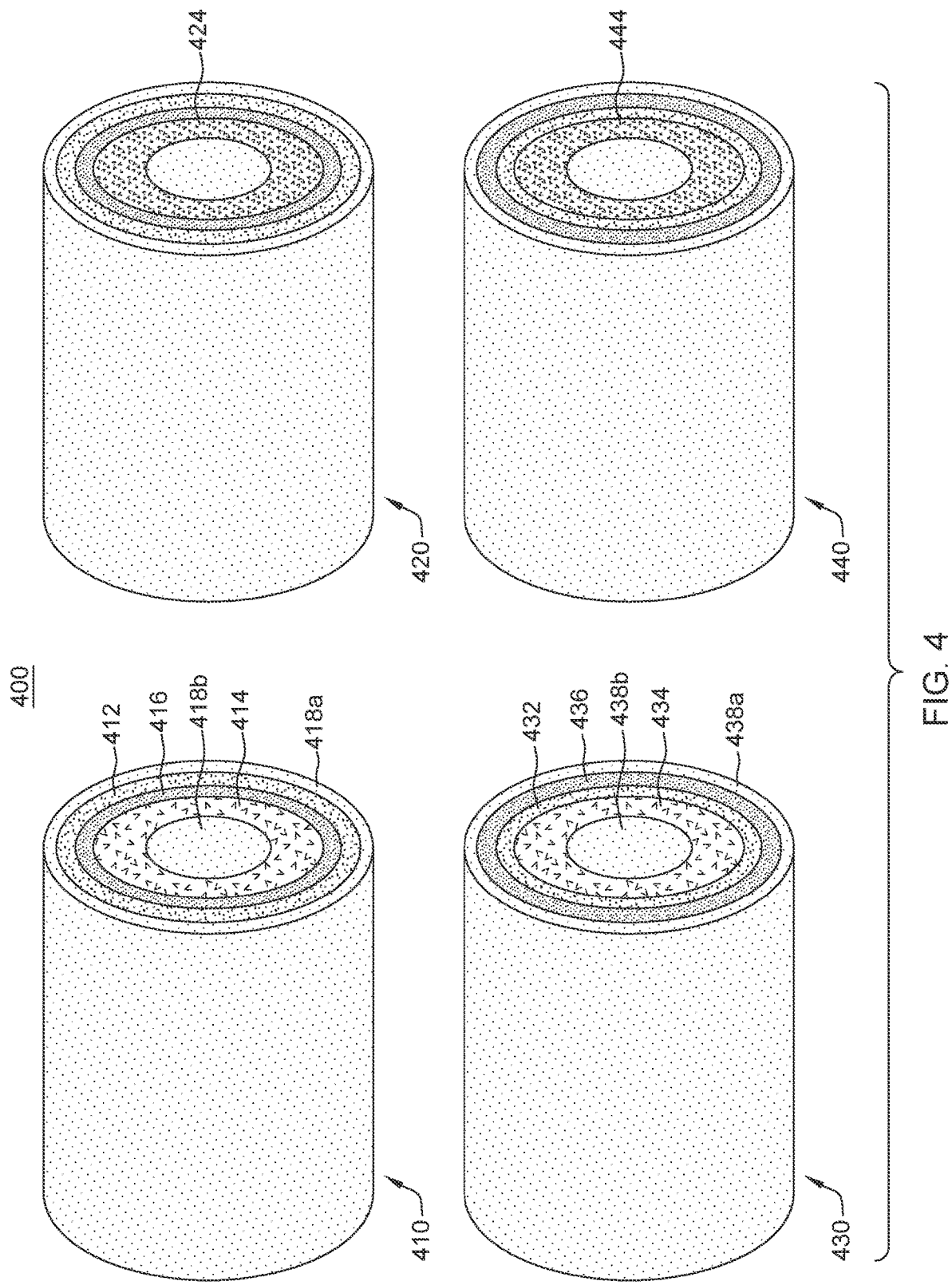
FIG. 4 is a cross-sectional view of a cylindrical tunable capacitor device of the present application during an amorphous stage and a crystalline stage of fabrication, according to an example embodiment of the present invention.

FIG. 4 is a cross-sectional view of a cylindrical tunable capacitor device of the present application in the amorphous state (410 and 430) and in the crystalline state (420 and 440), according to an example embodiment of the present invention.

In an embodiment, cylindrical tunable capacitor device 400 may include inner electrode core 418b (e.g., metallic core electrode) surrounded by an outer electrode layer 418a, wherein heating element 412 is adjacent to an inner surface of outer electrode layer 418a and adjacent to an outer surface of dielectric layer 416 that is adjacent to PCM layer 414 having an inner surface adjacent to inner electrode core 418b, thereby forming a cylindrical composite of all the described layers formed around inner electrode core 418b and extending outwards.

As described above, cylindrical tunable capacitor device 400 may be tuned by the methods described herein by energizing heating element 412 to heat PCM layer 414 to change a phase of PCM layer 414 to obtain a desired capacitance. For example, cylindrical tunable capacitor device 400 may be in a first phase 410, wherein PCM layer 414 in an amorphous phase. Heat may be applied to PCM layer 414 to change the phase of PCM layer 414 from the amorphous phase to a semi-amorphous-semi-crystalline phase and ultimately to a second phase 420, wherein PCM layer 424 is in a crystalline phase, as described above herein.

In another embodiment, cylindrical tunable capacitor device 400 may be in a first phase 430 corresponding to PCM layer 434 in an amorphous phase, wherein cylindrical tunable capacitor device 400 includes inner electrode core 438b (e.g., metallic core electrode) surrounded by outer electrode layer 438a with PCM layer 434, heating element 432, and dielectric layer 436 posited in between inner electrode core 438b and outer electrode layer 438a. In this example embodiment, heating element 432 is adjacent to an inner surface of dielectric layer 436 and adjacent to an inner surface of outer electrode layer 438a. Furthermore, heating element 432 may be in contact with PCM layer 434.

As described above, cylindrical tunable capacitor device 400 in the first phase 430 may be tuned by the methods described herein by energizing heating element 432 to heat PCM layer 434 to change a phase of PCM layer 434 to obtain a desired capacitance. For example, cylindrical tunable capacitor device 400 may be in the first phase 430 wherein PCM layer 434 is in the amorphous phase. Heat may be applied to PCM layer 434 to change the phase of PCM layer 434 from the amorphous phase to a semi-amorphous-semi-crystalline phase and ultimately to a second phase 440, wherein PCM layer 444 is in a crystalline phase, as described above herein.

Figure 5:
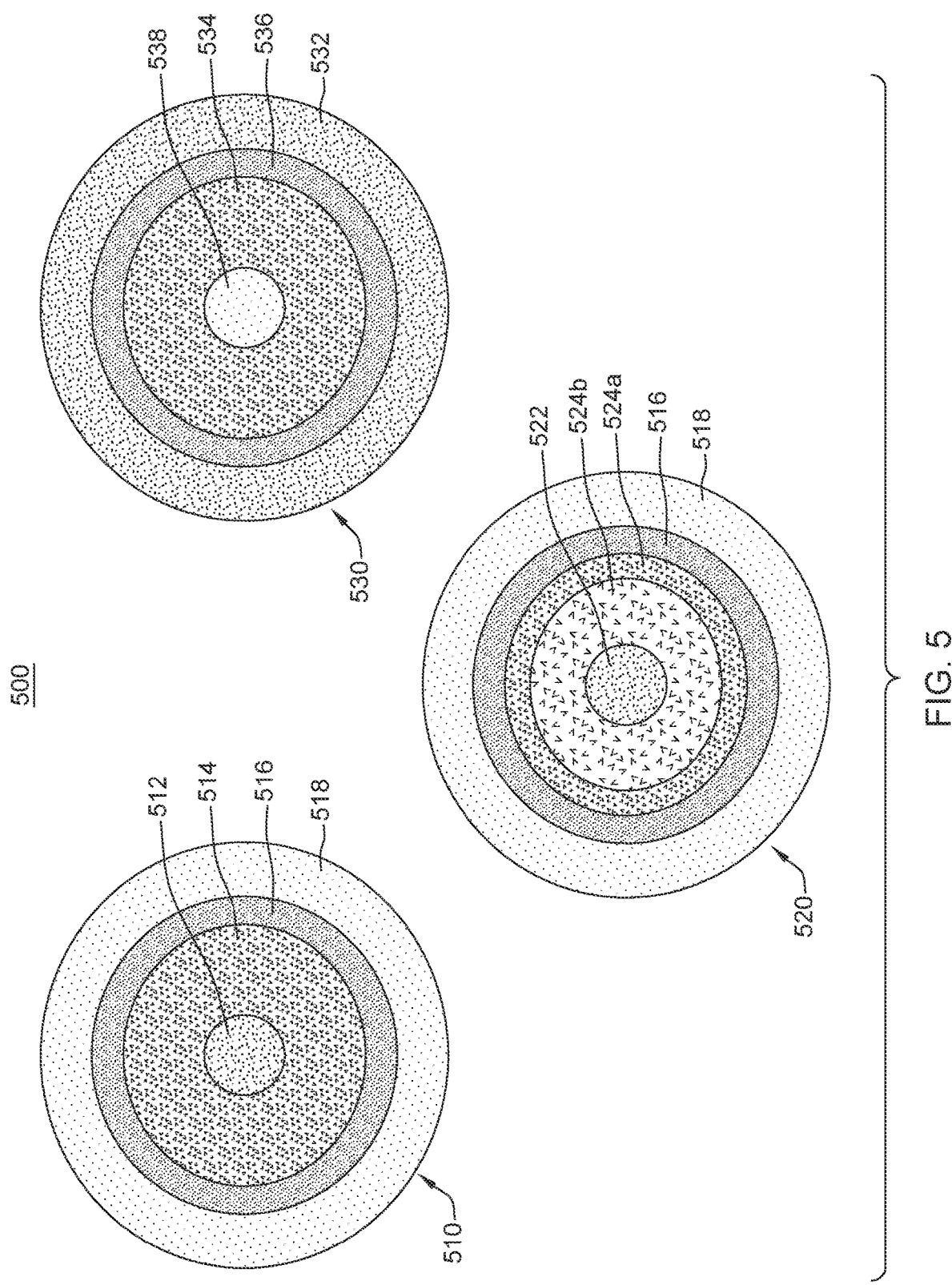
FIG. 5 illustrates cross-sectional views of cylindrical tunable capacitor devices of the present application, according to example embodiments of the present invention.

FIG. 5 illustrates cross-sectional views of cylindrical tunable capacitor devices of the present application, according to example embodiments of the present invention.

In an embodiment, cylindrical capacitor device 500 may be in a heating core electrode configuration in a first phase 510 corresponding to PCM layer 514 in a crystalline phase, where heating electrode 512, 522, 538 is the center of cylindrical capacitor device 500. In this embodiment, an outer surface of dielectric layer 514 is directly adjacent to an inner surface of outer electrode layer 518 and an outer surface of PCM layer 514 is adjacent to an inner surface of dielectric layer 516. Further in this embodiment, an inner surface of PCM layer 514 is adjacent to an outer surface of heating electrode 512, 522, 538.

In an embodiment, while cylindrical tunable capacitor device 500 is in first phase 510, heating electrode 512, 522, 538 may be energized to change a phase of PCM layer 514 from first phase 510 to second phase 520 corresponding to a semi-amorphous-semi-crystalline phase including a surrounding crystalline portion 524a and an amorphous portion 524b, wherein an outer surface of crystalline portion 524a is adjacent to an inner surface of dielectric layer 516.

In another embodiment, cylindrical capacitor device 500 may be in an outer heating electrode configuration 530 corresponding to PCM layer 534 in a crystalline phase, where heating electrode 532 is the outermost electrode of cylindrical capacitor device 500. In this embodiment, an outer surface of dielectric layer 536 is directly adjacent to an inner surface of heating electrode 532 and an outer surface of PCM layer 534 is adjacent to an inner surface of dielectric layer 536.

Figure 6:
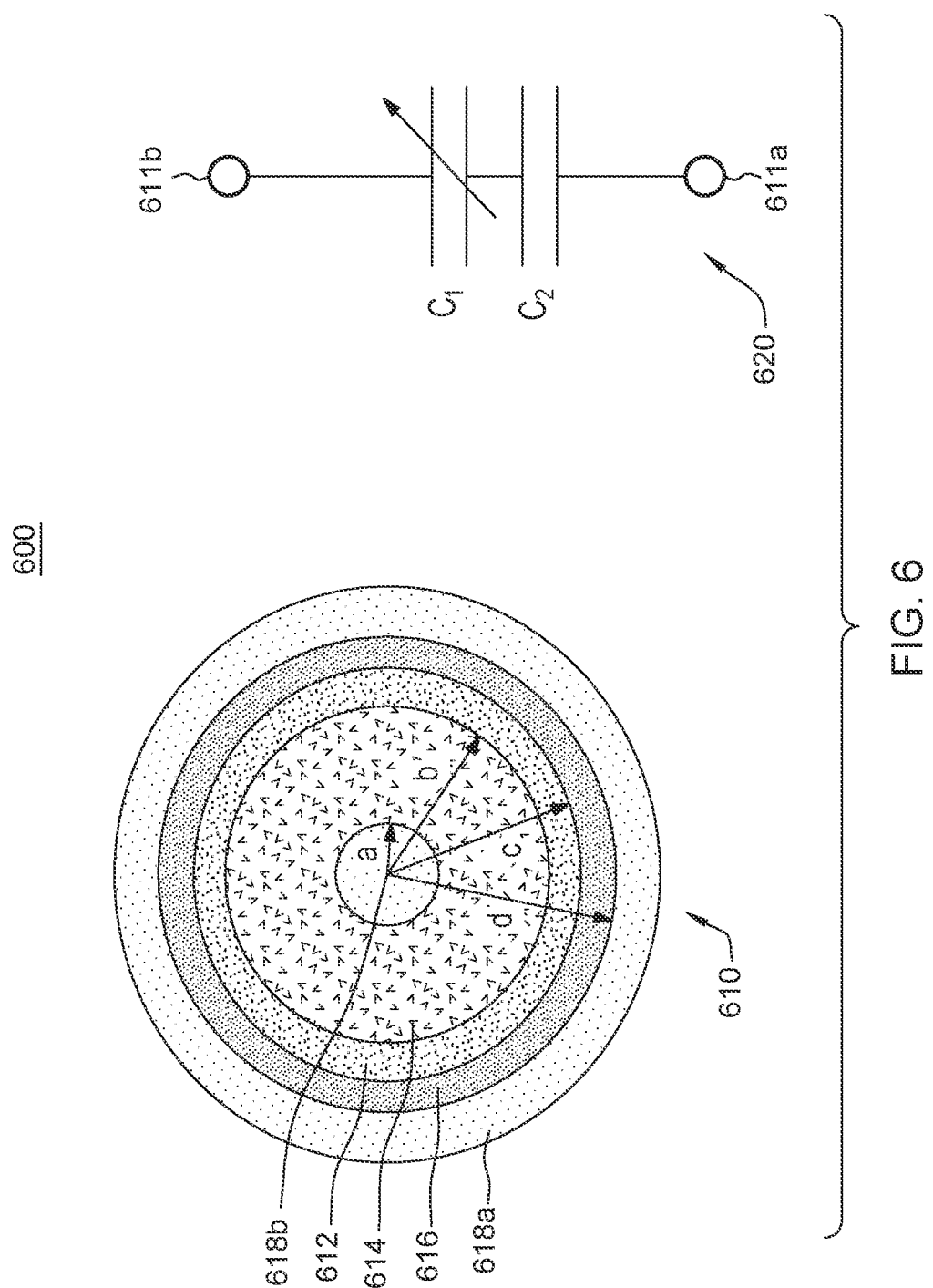
FIG. 6 illustrates a cross-sectional view of a cylindrical capacitor device and a lumped-element model also known as equivalent circuit of the device, according to an example embodiment of the present invention.

FIG. 6 illustrates a cross-sectional view 600 of a cylindrical capacitor device and a lumped-element model also known as equivalent circuit of the device, according to an example embodiment of the present invention.

In an embodiment, cylindrical capacitor device 610 is shown with inner electrode core 618b (e.g., metallic core electrode) distally opposed from outer electrode layer 618a with PCM layer 614, heating element 612, and dielectric layer 616 posited in between inner electrode core 618b and outer electrode layer 618a. In this example embodiment, heating element 612 is conductive enough (e.g., composed on TiN), so equivalent circuit 620 does not require an additional resistor element between capacitors $C_1$ and $C_2$. As shown, the entire volume of PCM layer 614 is in the amorphous phase. The capacitance for each capacitor in this configuration is represented by the following equations:

$$C_1 = 2\pi\varepsilon_0\varepsilon_{a\text{-}PCM}\ln\left(\frac{b}{a}\right), \text{ and}$$

$$C_2 = 2\pi\varepsilon_0\varepsilon_{HfO2}\ln\left(\frac{d}{c}\right),$$

wherein a is the radius of inner electrode core 618b, b is the radius from the center of inner electrode core 618b to the outer edge of PCM layer 614, c is the radius from the center of inner electrode core 618b to the inner surface of dielectric layer 616, and d is the radius from the center of inner electrode core 618b to the inner surface of outer electrode layer 618a. The constants $\varepsilon_{\alpha\text{-}PCM}$, and $\varepsilon_{HfO2}$ are the dielectric constant (i.e., relative permittivity) of amorphous PCM (α-PCM) and the dielectric layer 616 (e.g., hafnium oxide (HfO$_2$)) respectively, and $\varepsilon_0$ is the vacuum permittivity. In this example, it is assumed that dielectric layer 616 is comprised of HfO$_2$.

The total capacitance between $C_1$ and $C_2$ is measured between first terminal 611a and second terminal 611b and is represented by the following equation:

$$1/C_{12}=1/C_1+1/C_2.$$

The above formula shows that to obtain a large dynamic range, for the tunable capacitor dielectric layer 616 should be kept as thin as possible (i.e., without making it too leaky) and the material's dielectric constant should be as high as possible.

Figure 7:
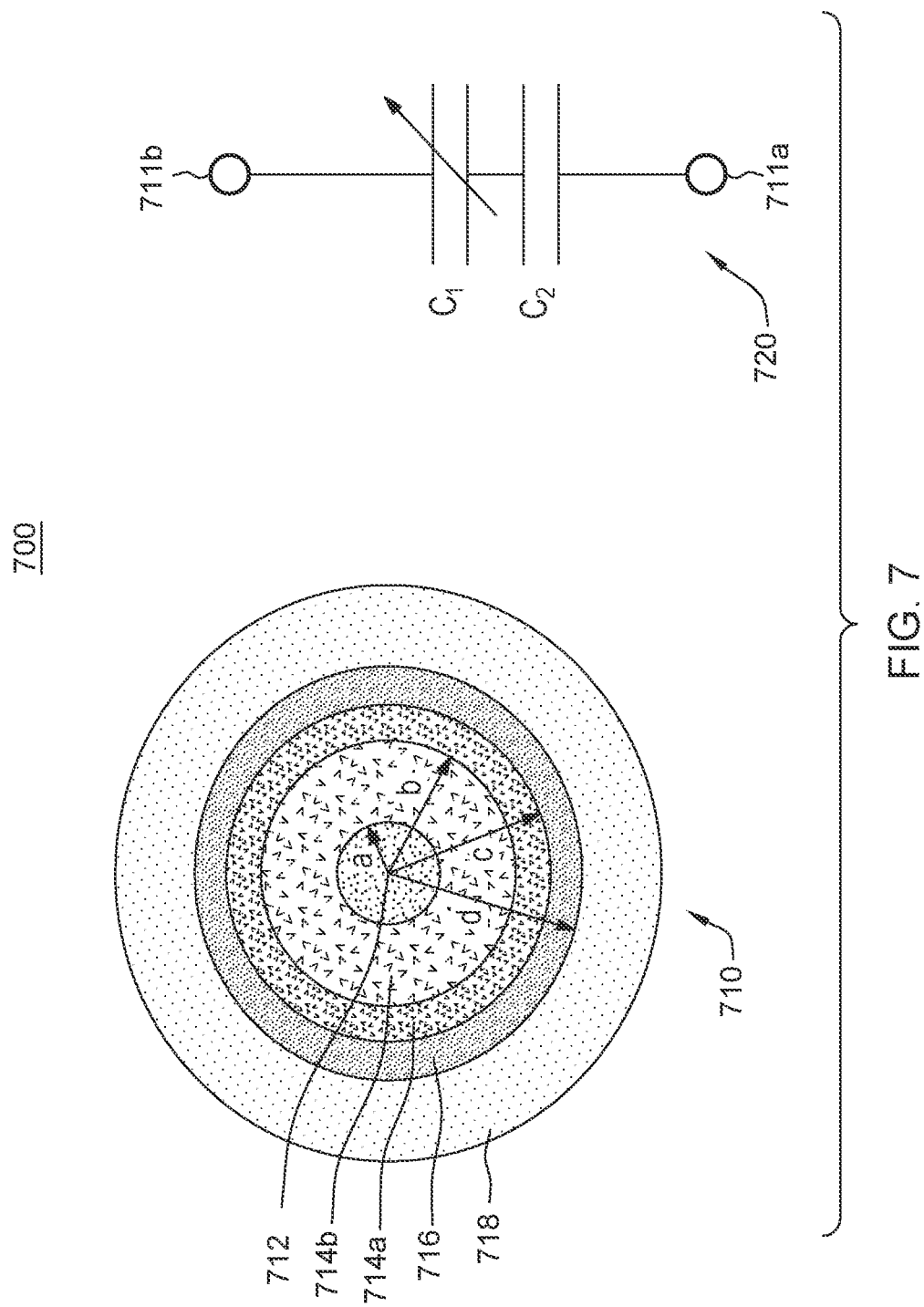
FIG. 7 illustrates a cross-sectional view of a cylindrical capacitor device in an intermediate capacitance state and an equivalent circuit of the device, according to an example embodiment of the present invention.

FIG. 7 illustrates a cross-sectional view 700 of a cylindrical capacitor device 710 in an intermediate capacitance state and an equivalent circuit of the device, according to an example embodiment of the present invention.

In an embodiment, cylindrical capacitor device 710 is shown in an intermediate state, as described in FIG. 5 as second phase 520, corresponding to a semi-amorphous-semi-crystalline phase including a surrounding crystalline portion 714a of PCM layer 714 and an amorphous portion 714b of PCM layer 714, wherein an outer surface of crystalline portion 714a is adjacent to an inner surface of dielectric layer 716 that is adjacent to and surrounded by outer electrode layer 718. In this example embodiment, heating electrode core 712 is conductive enough (e.g., composed on TiN), so intermediate state equivalent circuit 720 does not require an additional resistor element added in series to capacitors $C_1$ and $C_2$. The capacitance for each capacitor in this configuration is represented by the following equations:

$$C_1 = 2\pi\varepsilon_0\varepsilon_{a\text{-}PCM}\ln\left(\frac{b}{a}\right), \text{ and}$$

$$C_2 = 2\pi\varepsilon_0\varepsilon_{HfO2}\ln\left(\frac{d}{c}\right),$$

wherein a is the radius of heating electrode core 712, b is the radius from the center of heating electrode core 712 to the outer edge of the amorphous portion 714b of PCM layer 714, c is the radius from the center of heating electrode core 712 to the outer edge of the crystalline portion 714a of PCM layer 714, and d is the radius from the center of heating electrode core 712 to the outer edge of dielectric layer 716.

The total capacitance between $C_1$ and $C_2$ is measured between first terminal 711a and second terminal 711b and is represented by the following equation:

$$1/C_{12}=1/C_1+1/C_2.$$

In an embodiment, as the amorphous PCM region increases (i.e., radius b becoming larger), the capacitance decreases. Thus, by changing the energy delivered to the heater, amorphous portion 714b of PCM layer 714 is increased (or decreased) in size, and the total capacitance $C_{12}$ can be tuned to a specified value. The phase of PCM layer 714 (a & b) can be programmed using RESET and/or SET pulses. When a RESET pulse is applied to the electrode core 712 (e.g., heater), the PCM region in proximity to the heater will melt and then cool off in a very short time (a process known as melt-quench). The size of the amorphous region depends on the RESET pulse amplitude, with larger pulses leading to a larger radius b. When a SET pulse is applied some or all of the amorphous portion 714b PCM layer 714 will crystallize. The longer the length of the SET pulse the more of the material in PCM layer 714 will crystallize. As explained earlier, the SET pulse does not need to melt the PCM material. It usually delivers enough heat so the PCM temperature reaches or exceed the crystallization temperature.

Figure 8:
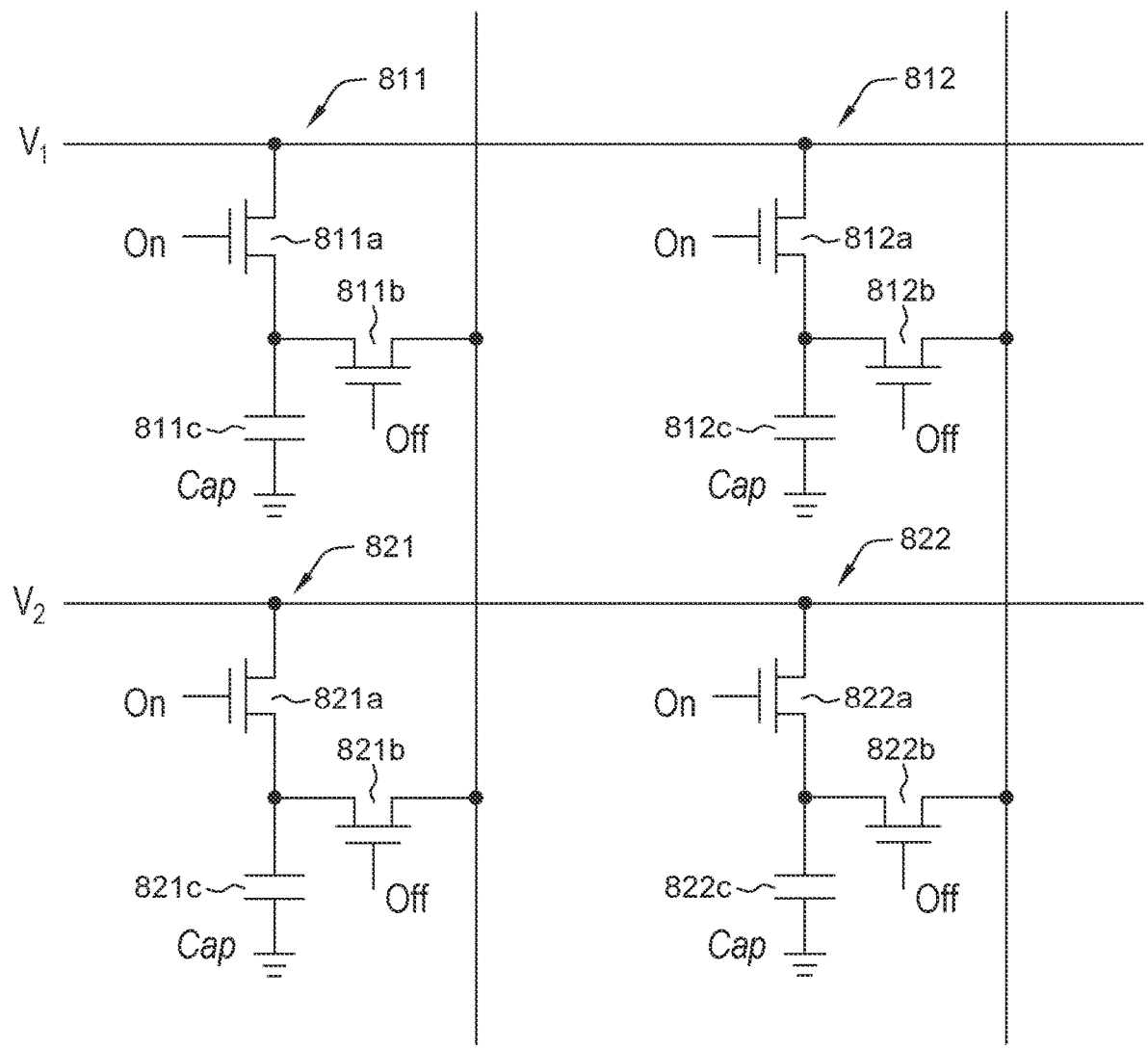
FIG. 8. illustrates a circuit array diagram of a neural network for charging (phase I) a tunable capacitor device, according to an example embodiment of the present invention.

FIG. 8 illustrates a circuit array diagram of a neural network (NN) for charging (phase I) a tunable capacitor device, according to an example embodiment of the present invention. As shown, charging circuit array diagram 800 (or "cross point array 800") includes circuit configurations (e.g., 811, 821, 812, 822) each including two transistors (e.g., charging transistor and discharging transistor) and a tunable capacitor. For example, circuit configuration 811 includes charging transistor 811a of the first set of transistors connected at a first end to a voltage line $V_1$ and connected to a second end to Cap 811c and discharging transistor 811b of the second set of transistors. The remaining circuit configurations 821, 812, and 822 have identical configurations.

In an embodiment, the method of performing a MAC operation for a NN having a tunable capacitor device 100 may include forming a circuit array representative of circuit array diagram 800 and providing one or more circuit configurations comprising tunable capacitors (e.g., 811c, 821c, 812c, 822c) connected to charging transistors (e.g., 811a, 821a, 812a, 822a), wherein circuit array diagram 800 is configured for applying input voltage to the tunable capacitors; and providing discharging transistors (e.g., 811b, 821b, 812b, 822b) configured for discharging the tunable capacitors, wherein the circuit array diagram 800 is configured to execute a part of a multiply accumulate operation.

In these configurations the computation of a MAC operation is accomplished in two phases of time. In the first phase, the charging transistors are energized to permit the flow of current through the charging capacitors and into the tunable capacitors to charge the capacitors and the discharging transistors are not energized to prevent the flow of current from the tunable capacitors. In an embodiment, one or more processors may be configured to energize the charging transistors to charge the capacitors. In an embodiment, one or more processors may be configured to tune the tunable capacitors to a desired or predetermined capacitance level, according to embodiments described herein.

In an embodiment, the method may further include charging the two or more tunable capacitors using the charging transistors to accumulate a total charge ($Q_{11}+Q_{21}+Q_{12}+Q_{22}$) across the one or more circuit configurations; and discharging the two or more tunable capacitors to integrate the total charge using the discharging transistors. The total charge may be determined by integrating the total currents flowing from the discharging transistors, as shown in FIG. 9 and described below.

Figure 9:
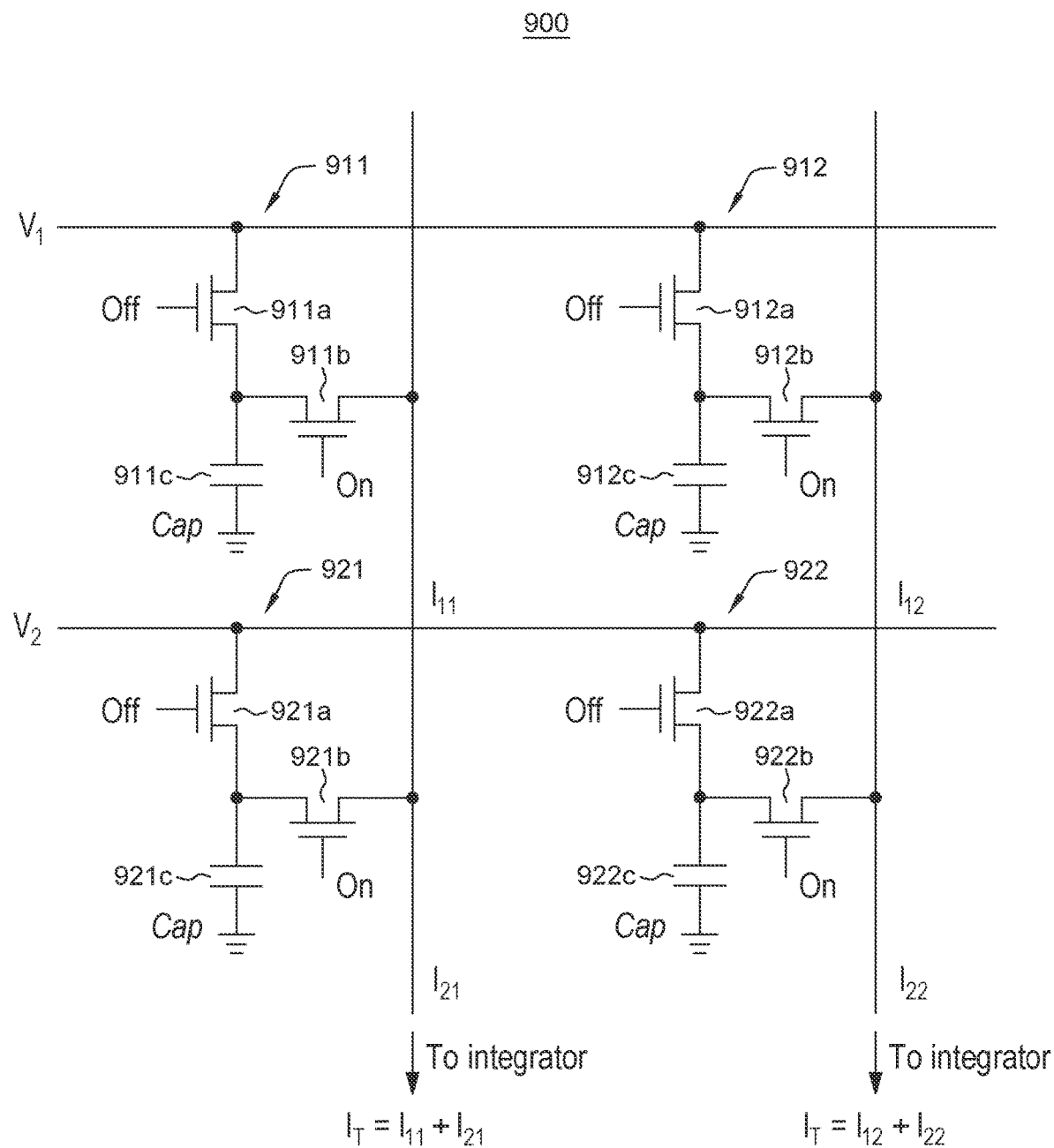
FIG. 9 illustrates the second time phase of the circuit array diagram of FIG. 8 during discharging (phase II) of a tunable capacitor device, according to an example embodiment of the present invention.

FIG. 9 illustrates the second time phase of the circuit array diagram of FIG. 8 during discharging (phase II) of a tunable capacitor device, according to an example embodiment of the present invention. As shown, discharging circuit array diagram 900 (or "cross point array") has the same configuration as charging circuit array diagram 800, except that the charging transistors (e.g., 911a, 921a, 912a, 922a) are not energized to prevent current flow into the tunable capacitors (e.g., 911c, 921c, 912c, 922c) and the discharging transistors (e.g., 911b, 921b, 912b, 922b) are energized to permit the flow of current from the tunable capacitors to discharge the tunable capacitors, wherein discharging circuit array diagram 900 is configured to execute a part of a MAC operation.

In these configurations, the discharging transistors are energized to permit the flow of current through the discharging transistors and out to an integrator and the charging transistors are not energized to prevent the flow of current through the charging transistors. In the first phase, each of the tunable capacitors are charged to hold charge $Q_i=C_i\times V_i$, to perform the "multiply" part of the MAC operation. In the second phase, the tunable capacitors are discharged, and the total charge is integrated, $Q_T=\Sigma Q_i$, to perform the "accumulate" part of the MAC operation.

Figure 10:
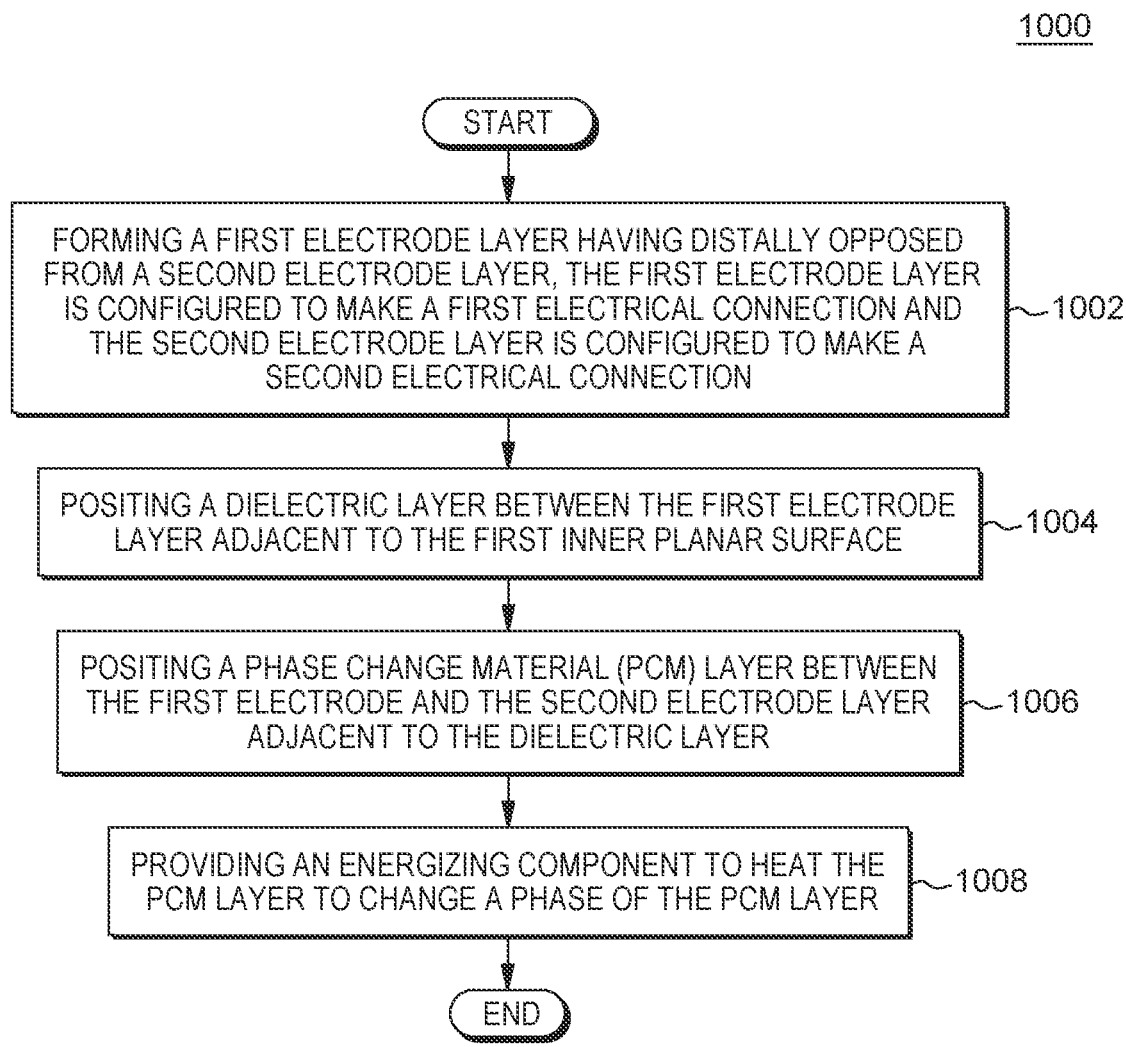
FIG. 10 is a flowchart of a method for forming a tunable capacitor device, according to an example embodiment of the present invention.

FIG. 10 is a flowchart of a method 1000 for forming a tunable capacitor device, according to an example embodiment of the present invention.

In an embodiment, method 1000 for forming a nonvolatile tunable capacitor device may include forming 1002 a first electrode layer distally opposed from a second electrode layer, the first electrode layer is configured to make a first electrical connection and the second electrode layer is configured to make a second electrical connection.

Method 1000 may further include positing 1004 a dielectric layer between the first electrode layer adjacent to the first inner planar surface and adjacent to the second inner planar surface of the second electrode layer. The first electrode layer may include a first inner planar surface distally opposed from a second inner planar surface of the second electrode layer. The first electrode layer may include a first outer planar surface configured to make the first electrical connection and the second electrode layer may include a second outer planar surface configured to make the second electrical connection.

Method 1000 may further include positing 1006 a phase change material (PCM) layer between the first electrode layer and the second electrode layer adjacent to the dielectric layer.

Method 1000 may further include providing 1008 an energizing component to heat the PCM layer to change a phase of the PCM layer. The energizing component may include a heating element that is coplanar with either one of the first electrode layer and the second electrode layer, which when energized is configured to apply heat to the PCM layer. The energizing component may include a resistive element in direct contact with the PCM layer, which when energized is configured to apply heat to the PCM layer. For example, the resistive element may be an electrical probe.

The phase of the PCM layer may be selectively changeable between at least an amorphous phase corresponding to a resistive PCM layer and a crystalline phase corresponding to a conductive PCM layer. The PCM layer may include a composition of $Ge_2Sb_2Te_5$, GeTe, or $Sb_2Te_3$. The dielectric layer may include a composition of $HfO_2$.

In another embodiment, a method of performing a multiply-accumulate (MAC) operation for a Neural Network (NN), the NN comprising one or more circuit configurations (e.g., 811, 812, 821, 822) may include a charging transistor (e.g., 811a, 812a, 821a, 822a), a discharging transistor (e.g., 811b, 812b, 821b, 822b) and a tunable capacitor (e.g., 811c, 812c, 821c, 822c). In an embodiment, the charging transistor includes a first charging transistor terminal connected to a voltage line $V_1$. Further, the charging transistor also includes second charging transistor terminal connected to a first capacitor terminal of a tunable capacitor, wherein the tunable capacitor includes a second capacitor terminal connected to a ground terminal. Further, the one or more circuit configurations may further include a discharging transistor that includes a first discharging transistor terminal connected to the second charging transistor terminal and the first capacitor terminal. Further, the discharging transistor also includes a second discharging terminal connected to a current line.

Further, the method of performing the MAC operation for a NN may include providing a predefined amount of heat to the tunable capacitor (e.g., 811c, 812c, 821c, 822c) for a predefined amount of time, wherein the tunable capacitor has a first capacitance value, and the predefined amount of heat may be sufficient to change the first capacitance value to a second capacitance value.

The method of performing the MAC operation for a NN may include charging the tunable capacitor (e.g., 811c, 812c, 821c, 822c) for a first predefined amount of time by applying an input voltage Vito the tunable capacitor via the charging transistor (e.g., 811a, 812a, 821a, 822a) in a closed state and the discharging transistor (e.g., 811b, 812b, 821b, 822b) in an open state; and discharging the tunable capacitor for a second predefined amount of time by stopping the input voltage to the tunable capacitor via the charging transistor in the open state and the discharging transistor in the closed state, wherein charges flow from the tunable capacitor through the discharging transistor to an integrator circuit.

In an embodiment, the method of performing the MAC operation for a NN, wherein providing the predefined amount of heat is configured to set the tunable capacitor to a weight of the NN represented as the second capacitance value.

In an embodiment, the method of performing the MAC operation for a NN may further include determining a total charge of the one or more circuit configurations comprising the tunable capacitor by integrating the charges of the one or more circuit configurations through the discharging transistor using the integrator circuit.

In an embodiment, the method of performing the MAC operation for a NN, wherein providing the predefined amount of heat is configured to set the tunable capacitor to a weight of the NN represented as the second capacitance value.

In an embodiment, a phase of a PCM layer of the tunable capacitor may be selectively changeable between an amorphous phase corresponding to a resistive PCM layer to a crystalline phase corresponding to a conductive PCM layer.

Figure 11:
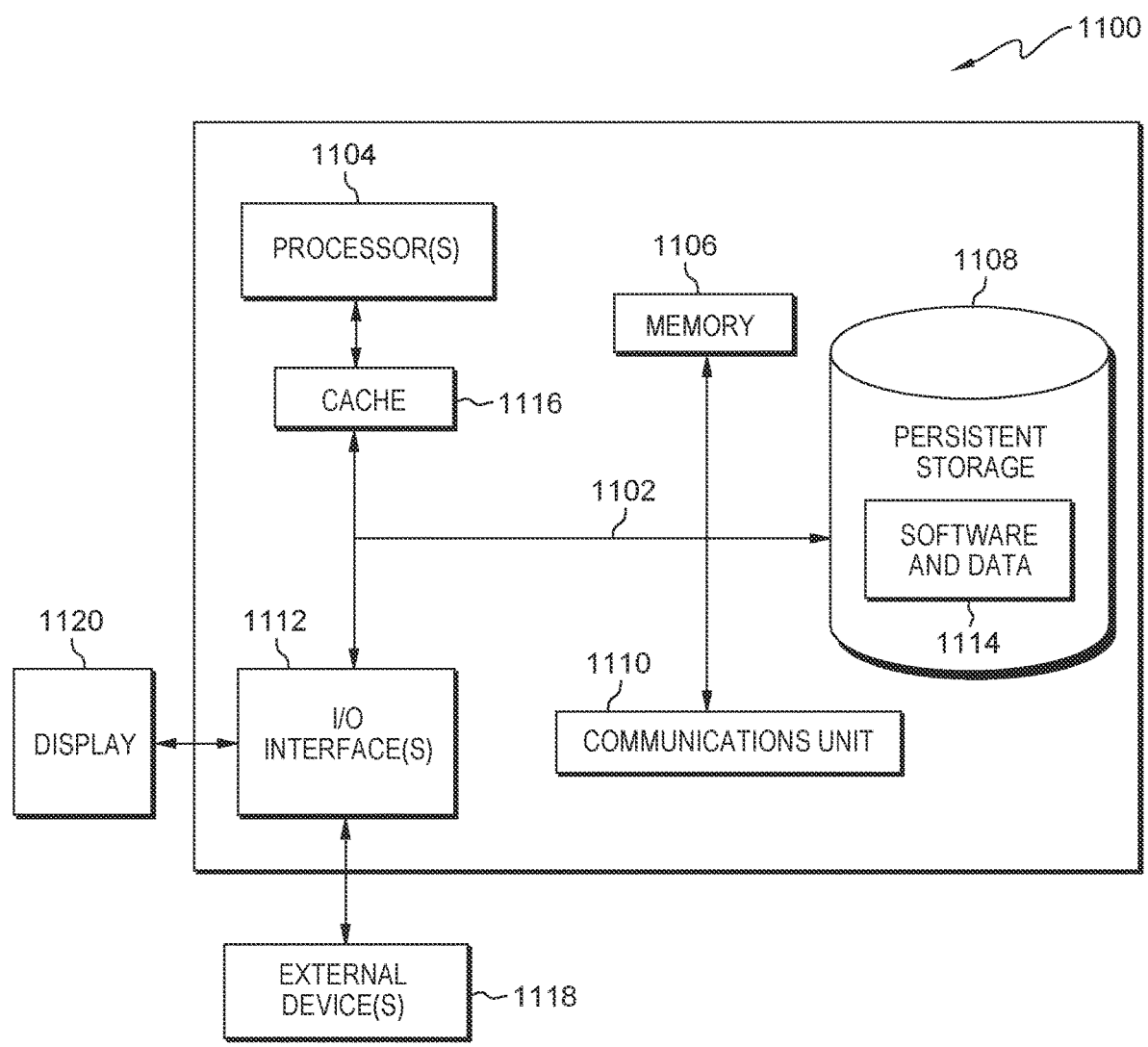
FIG. 11 depicts a block diagram of components of the server computer executing the method for forming a tunable capacitor device, according to an example embodiment of the present invention.

FIG. 11 depicts a block diagram of components of the server computer executing the method 1000 for forming a tunable capacitor device, according to an example embodiment of the present invention. It should be appreciated that FIG. 11 provides only an illustration of one implementation and does not imply any limitations with regard to the environments in which different embodiments can be implemented. Many modifications to the described environment can be made.

Method 1000 may be executed on server computer or computing device 1100 that includes communications fabric 1102, which provides communications between cache 1116, memory 1106, persistent storage 1108, communications unit 1110, and input/output (I/O) interface(s) 1112. Communications fabric 1102 can be implemented with any architecture designed for passing data and/or control information between processors (such as microprocessors, communications and network processors, etc.), system memory, peripheral devices, and any other hardware components within a system. For example, communications fabric 1102 can be implemented with one or more buses or a crossbar switch.

Memory 1106 and persistent storage 1108 are computer readable storage media. In this embodiment, memory 1106 includes random access memory (RAM). In general, memory 1106 can include any suitable volatile or non-volatile computer readable storage media. Cache 1116 is a fast memory that enhances the performance of computer processor(s) 1104 by holding recently accessed data, and data near accessed data, from memory 1106.

Programs may be stored in persistent storage 1108 and in memory 1106 for execution and/or access by one or more of the respective computer processors 1104 via cache 1116. In an embodiment, persistent storage 1108 includes a magnetic hard disk drive. Alternatively, or in addition to a magnetic hard disk drive, persistent storage 1108 can include a solid-state hard drive, a semiconductor storage device, read-only memory (ROM), erasable programmable read-only memory (EPROM), flash memory, or any other computer readable storage media that is capable of storing program instructions or digital information.

The media used by persistent storage 1108 may also be removable. For example, a removable hard drive may be used for persistent storage 1108. Other examples include optical and magnetic disks, thumb drives, and smart cards that are inserted into a drive for transfer onto another computer readable storage medium that is also part of persistent storage 1108.

Communications unit 1110, in these examples, provides for communications with other data processing systems or devices. In these examples, communications unit 1110 includes one or more network interface cards. Communications unit 1110 may provide communications through the use of either or both physical and wireless communications links. Programs, as described herein, may be downloaded to persistent storage 1108 through communications unit 1110.

I/O interface(s) 1112 allows for input and output of data with other devices that may be connected to a server computer and/or a computing device 1100. For example, I/O interface 1112 may provide a connection to external devices 1118 such as an image sensor, a keyboard, a keypad, a touch screen, and/or some other suitable input device. External devices 1118 can also include portable computer readable storage media such as, for example, thumb drives, portable optical or magnetic disks, and memory cards. Software and data 1114 used to practice embodiments of the present invention can be stored on such portable computer readable storage media and can be loaded onto persistent storage 1108 via I/O interface(s) 1112. I/O interface(s) 1112 also connect to display 1120.

Display 1120 provides a mechanism to display data to a user and may be, for example, a computer monitor.

Software and data 1114 described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of performing a multiply-accumulate (MAC) operation for a neural network (NN), the method comprising:
   providing one or more circuit configurations, wherein the one or more circuit configurations comprise:
      a charging transistor comprising:
         a first charging transistor terminal connected to a voltage line; and
         a second charging transistor terminal connected to a first capacitor terminal of a tunable capacitor, wherein the tunable capacitor comprises a second capacitor terminal connected to a ground terminal;
      a discharging transistor comprising:
         a first discharging terminal connected to the second charging transistor terminal and the first capacitor terminal; and
         a second discharging terminal connected to a current line;
   providing a predefined amount of heat to the tunable capacitor for a predefined amount of time, wherein the tunable capacitor has a first capacitance value and the predefined amount of heat is sufficient to change the first capacitance value to a second capacitance value;
   charging the tunable capacitor for a first predefined amount of time by applying an input voltage to the tunable capacitor via the charging transistor in a closed state and the discharging transistor in an open state;
   discharging the tunable capacitor for a second predefined amount of time by stopping the input voltage to the tunable capacitor via the charging transistor in the open state and the discharging transistor in the closed state, wherein charges flow from the tunable capacitor through the discharging transistor to an integrator circuit;
   determining a total charge of the one or more circuit configurations comprising the tunable capacitor by integrating the charges of the one or more circuit configurations through the discharging transistor using the integrator circuit; and
   generating a result for the MAC operation based, at least in part, on the total charge of the one or more circuit configurations.

2. The method of claim 1, wherein providing the predefined amount of heat is configured to set the tunable capacitor to a weight of the NN represented as the second capacitance value.

3. The method of claim 1, further comprising:
   determining the predefined amount of heat as a temperature change sufficient to achieve a desired weight corresponding to the second capacitance value.

4. The method of claim 1, wherein a phase of a PCM layer of the tunable capacitor is selectively changeable between an amorphous phase corresponding to a resistive PCM layer to a crystalline phase corresponding to a conductive PCM layer.

5. The method of claim 1, wherein a PCM layer of the tunable capacitor comprises a composition of one of $Ge_2Sb_2Te_5$, GeTe, and $Sb_2Te_3$.

6. The method of claim 1, wherein a dielectric layer of the tunable capacitor comprises a composition of $HfO_2$.

* * * * *